(12) United States Patent
Yu

(10) Patent No.: US 6,265,293 B1
(45) Date of Patent: Jul. 24, 2001

(54) CMOS TRANSISTORS FABRICATED IN OPTIMIZED RTA SCHEME

(75) Inventor: Bin Yu, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/384,121

(22) Filed: Aug. 27, 1999

(51) Int. Cl.[7] .................................................. H01L 21/425
(52) U.S. Cl. ......................... 438/528; 438/301; 438/520
(58) Field of Search .................................. 438/520, 527, 438/528, 510, 199, 299, 301

(56) References Cited

U.S. PATENT DOCUMENTS

| | | | |
|---|---|---|---|
| 4,683,645 | 8/1987 | Naguib et al. | 438/297 |
| 4,745,082 | 5/1988 | Kwok . | |
| 4,784,718 | 11/1988 | Mitani et al. . | |
| 4,835,112 | 5/1989 | Pfiester et al. | 438/305 |
| 4,954,867 * | 9/1990 | Hosaka | 257/639 |
| 5,108,954 | 4/1992 | Sandhu et al. | 438/297 |
| 5,258,637 | 11/1993 | Sandhu et al. | 257/384 |
| 5,264,382 | 11/1993 | Watanabe . | |
| 5,374,575 | 12/1994 | Kim et al. . | |
| 5,391,510 | 2/1995 | Hsu et al. . | |
| 5,393,685 | 2/1995 | Yoo et al. | 438/231 |
| 5,429,956 | 7/1995 | Shell et al. . | |
| 5,593,907 | 1/1997 | Anjum et al. | 438/298 |
| 5,607,884 | 3/1997 | Byun | 438/297 |
| 5,654,570 * | 8/1997 | Agnello | 257/338 |
| 5,675,159 | 10/1997 | Oku et al. . | |
| 5,716,861 | 2/1998 | Moslehi . | |
| 5,793,090 | 8/1998 | Gardner et al. | 257/408 |
| 5,811,323 | 9/1998 | Miyasaka et al. | 438/151 |
| 5,825,066 | 10/1998 | Buynoski | 257/345 |
| 5,851,869 | 12/1998 | Urayama | 438/238 |
| 5,856,225 | 1/1999 | Lee et al. . | |
| 5,858,843 | 1/1999 | Doyle et al. . | |
| 5,888,888 | 3/1999 | Talwar et al. | 438/533 |
| 5,908,307 | 6/1999 | Talwar et al. | 438/199 |
| 5,915,196 * | 6/1999 | Mineji | 438/526 |
| 5,953,616 | 9/1999 | Ahn | 438/305 |
| 6,008,111 * | 12/1999 | Fushida et al. | 438/584 |
| 6,030,863 | 2/2000 | Chang et al. | 438/229 |
| 6,037,204 * | 3/2000 | Chang et al. | 438/231 |
| 6,072,222 | 6/2000 | Nistler | 257/383 |
| 6,080,645 | 6/2000 | Pan | 438/585 |
| 6,103,609 | 8/2000 | Lee et al. | 438/592 |

FOREIGN PATENT DOCUMENTS

| | | |
|---|---|---|
| 3-248433 | 11/1991 | (JP) . |
| 4-123439 | 4/1992 | (JP) . |
| 5-160396 | 6/1993 | (JP) . |

OTHER PUBLICATIONS

Wolf, S., Tauber R.N.; Silicon Processing for the VLSI Era Vol. 1: Process Technology, Lattice Press, Sunset Beach, CA, 1986, pp. 296–308.*

International Electronics Meeting Dec. 7, 1997 "Sub–100nm Gate Length Metal Gate NMOS Transistors Fabricated by a Replacement Gate Process" Chatterjee, et al. 1997 IEEE.

"Ultra–Thin–Body Silicon–On–Indulator MOSET's for Terabit–Scale Integration" Yu, et al.

"Sub 50–nm Fin FET: PMOS" Huang, et al. 1999 IEEE.

* cited by examiner

*Primary Examiner*—John F. Niebling
*Assistant Examiner*—Christopher Lattin
(74) *Attorney, Agent, or Firm*—Foley & Lardner

(57) ABSTRACT

A method of fabricating an integrated circuit with ultra-shallow source/drain junctions utilizes a dual amorphization technique. The technique creates a shallow amorphous region and a deep amorphous region 300 nm thick. The shallow amorphous region is between 10–15 nm below the top surface of the substrate, and the deep amorphous region is between 150–200 nm below the top surface of the substrate. The process can be utilized for P-channel or N-channel metal oxide semiconductor field effect transistors (MOSFETs). A step separate from the annealing step for the source/drain regions is utilized for annealing the gate conductor.

20 Claims, 2 Drawing Sheets

US 6,265,293 B1

CMOS TRANSISTORS FABRICATED IN OPTIMIZED RTA SCHEME

CROSS REFERENCE TO RELATED APPLICATIONS

This patent application is related to U.S. application Ser. No. 09/187,890, by Yu et al., entitled "A Method of Fabricating an Integrated Circuit with Ultra-Shallow Drain/Source Extensions", U.S. application Ser. No. 0.9/187,635, by Yu, et al., entitled "A Damascene Process for Forming Ultra-Shallow Source/Drain Extensions in ULSI MOSFET", and U.S. application Ser. No. 09/187,172, by Yu, entitled "Recessed Channel Structure for Manufacturing Shallow Source/Drain Extensions" all filed on Nov. 6, 1998 and assigned to the assignee of the present invention.

FIELD OF THE INVENTION

The present invention relates to integrated circuits and to methods of manufacturing integrated circuits. More particularly, the present invention relates to a method of manufacturing integrated circuits having CMOS transistors with an optimized annealing scheme.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETs). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-inducted barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacers.

As transistors disposed on integrated circuits (ICs) become smaller, transistors with shallow and ultra-shallow source/drain extensions have become more difficult to manufacture. For example, smaller transistors should have ultra-shallow source and drain extensions (less than 30 or 40 nanometer (nm) junction depth). Forming source and drain extensions with junction depths of less than 30 nm is very difficult using conventional fabrication techniques. Conventional ion implantation, diffusion doping and activation techniques make transistors on the IC susceptible to a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically into the bulk semiconductor substrate.

As the critical dimensions for transistors are minimized, the total thermal budget (Bt) that the drain and source regions and the semiconductor gate experience becomes more critical. Fundamentally, reducing the thermal budget has several advantages including: (1) more accurate formation of ultra-shallow junctions; (2) formation of ultra-tight dope profiles, such as, profiles for halo implants or retrograded channel implants; and (3) reduction of dopant penetration through the gate oxide and into the gate (e.g., Boron (B) in P-channel MOSFETs). Both shallow source and drain extensions and tight profile pocket regions help to improve the immunity of a transistor to short-channel effects.

Heretofore, conventional processes have reduced thermal budgets for CMOS transistor fabrication by utilizing a rapid thermal annealing (RTA) to heat the substrate. RTA does not require a significant period of time to heat the substrate. Another approach involves a spike RTA which increases the ramping rate of RTA. Nonetheless, the substrate must be exposed to the RTA for a time period of one second or more to appropriately diffuse and activate dopants.

According to conventional processes (e.g., self-aligned CMOS fabrication processes) the polysilicon gate and source and drain regions are implanted (doped) during the same fabrication step. After doping the gate and source and drain regions, the substrate is subject to a heating process which activates the dopant in both the gate and the source and drain regions. However, electrical activation of dopants in the gate requires a relatively high thermal budget (e.g., higher temperature than activation of dopants in the source and drain regions). The higher thermal budget increases the active dopant concentration in the gate which gives the transistor more drive current due to reduced gate-depletion effect. As described above, higher temperatures (higher thermal budgets) increase the susceptibility of the transistor to short channel effects. Therefore, optimizing the heating step for both the gate and for the source and drain regions is difficult.

Thus, there is a need for a method of manufacturing CMOS transistors that does not utilize a single RTA process for the gate and the source and drain regions. Further still, there is a need for transistors that are not as susceptible to gate depletion effect and short channel effects. Even further still, there is a need for an efficient method of manufacturing source and drain regions and polysilicon-based gate conductors.

SUMMARY OF THE INVENTION

An exemplary embodiment is related to a method of manufacturing an integrated circuit. The method includes forming a gate conductor including doped semiconductor material on a top surface of a substrate, annealing the gate conductor in a high temperature process, providing a first pre-amorphization implant, providing a post-amorphization implant, doping the substrate to form source and drain regions, and annealing the substrate in a low temperature process. The pre-amorphization implant creates a first amorphous region near the top surface of the substrate. The post-amorphization implant creates a deep amorphous region in the semiconductor substrate.

Another embodiment is related to a method of manufacturing a ultra-large scale integrated circuit. The integrated circuit includes a plurality of field effect transistors having shallow source and drain extensions. The method includes steps of forming the gate structure on a top surface of a semiconductor substrate and annealing the gate structure in a high thermal budget process. The method also includes providing a shallow amorphization implant, providing a deep amorphization implant, and annealing the substrate in a low thermal budget process. The shallow amorphization implant creates a shallow amorphous region near the top surface. The deep amorphization implant creates a deep amorphous region in the substrate.

Yet another embodiment relates to a method of providing field effect transistors associated with an ultra-large scale integrated circuit. The method includes forming a plurality of gate structures including an undoped gate conductor on a top surface of a silicon substrate, doping the gate conductor, and annealing the gate conductor. The method also includes doping the substrate for source and drain regions, and annealing the substrate to form the source and drain regions.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
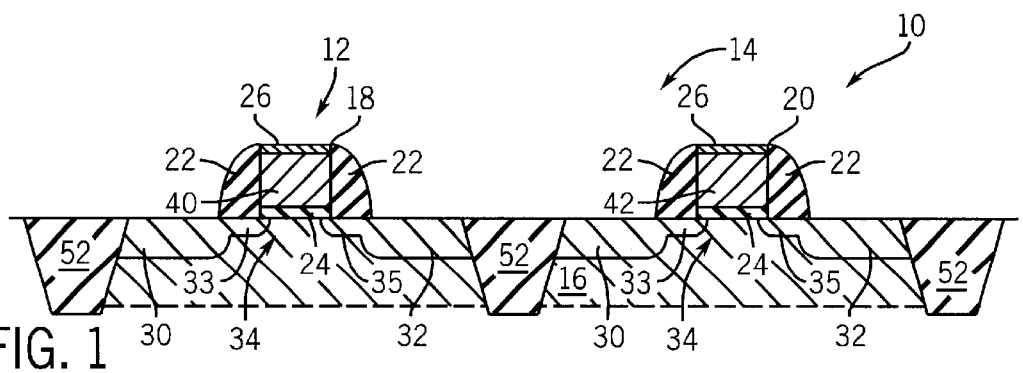
FIG. 1 is a cross-sectional view of a portion of an integrated circuit fabricated in accordance with an exemplary embodiment of the present invention.

With reference to FIG. 1, a portion 10 of an integrated circuit (IC) or chip includes a transistor 12 and a second transistor 14. Portion 10 is preferably part of an ultra-large-scale integrated (ULSI) circuit having 1,000,000 or more transistors. Portion 10 is manufactured as part of the IC on a semiconductor wafer, such as, a silicon wafer.

Transistors 12 and 14 are disposed on a substrate 16 that is preferably silicon. Transistor 12 includes a gate structure or stack 18, and transistor 14 includes a gate structure or stack 20. Each of gate stack 18 and gate stack 20 includes sidewall spacers 22, a gate dielectric 24, and a protection layer 26. Protection layer 26 is preferably silicon oxynitride (SiON) or silicon nitride ($Si_3N_4$) material. Spacers 22 and dielectric 24 can be silicon dioxide ($SiO_2$) or other insulating material. Spacers 22 are deposited as a silicon dioxide layer by chemical vapor deposition (CVD), which is selectively etched. Dielectric 24 is preferably thermally grown. Alternatively, spacers 22 can be a silicon nitride material or other insulative material.

Transistors 12 and 14 also both include a drain region 30, a source region 32, and a channel 34. Transistors 12 can be an N-channel transistor, and transistor 14 can be a P-channel transistor (or vice-versa).

Source and drain regions 30 and 32 each include shallow source and drain extensions 23 and 25. Extensions 23 and 25 are preferably ultra-shallow extensions (e.g., junction depth less than 30–40 nanometers) which are thinner than the deepest portions of regions 30 and 32. Extensions 23 and 25 are connected to regions 30 and 32, respectively, and are disposed partially underneath gate dielectric 24. Ultra-shallow extensions 23 and 25 help transistors 12 and 14 achieve substantial immunity to short channel effects.

Gate stack 18 includes a gate conductor 40, and gate stack 20 includes a gate conductor 42. Gate conductors 40 and 42 are preferably manufactured from a semiconductor material, such as, polysilicon, or polysilicon doped or implanted with another semiconductor material, such as, germanium (Ge). Gate conductor 40 is heavily doped with an N-type dopant such as phosphorous (P), arsenic (As) or other dopant, and gate conductor 42 is heavily doped with a P-type dopant, such as, boron (B), boron diflouride ($BF_2$) or other dopants.

Transistors 12 and 14 can be any type of transistor. Most preferably, transistors 12 and 14 are complementary MOSFET transistors (N-channel and P-channel MOSFET transistors, respectively). The transistors 12 and 14 can have threshold voltages from 0.2 V to 0.4 V for N-channel and from –0.2 to –0.4 for P-channel, respectively. Gate conductors 40 and 42 both have significant dopant activation. Preferably, a high temperature, rapid thermal anneal (RTA) (e.g., 1050–1200° C.) is used for dopant activation, thereby increasing the drive current of transistors 12 and 14.

Transistors 12 and 14 are isolated from each other by insulative structures 52. Insulative structures 52 are preferably a silicon dioxide material fabricated according to a shallow transfer isolation (STI) process. Alternatively, a local oxidation of silicon (LOCOS) process can be utilized to form structures 52.

Gate dielectric 24 is preferably 20–50 Å thick. Gate structures or stacks 18 and 20 preferably have a total thickness (height) of 1200–1500 Å for CMOS technology generations with a gate line width of 100 nanometers or less. Source and drain regions 30 and 32 preferably have a deep junction depth of 600–800 Å, and extensions 23 and 25 have a depth of 100–300 Å. The concentration of dopants in source and drain regions 30 and 32 is approximately $1 \times 10^{19} – 5 \times 10^{19}$ dopants per cubic centimeter. The width of spacers 22 is approximately 400–600 Å. Layer 26 is preferably 300–400 Å thick and serves to protect conductors 40 and 42 during subsequent processing steps and acts as an anti-reflective coating (ARC) for lithographic processing steps.

With reference to FIGS. 1–7, the fabrication of portion 10, including transistors 12 and 14 is described below as follows. Portion 10 is fabricated in a dual RTA scheme which advantageously fully activates dopants in gate conductors 40 and 42 and yet does not adversely affect the formation of source and drain extensions 23 and 25.

Figure 2:
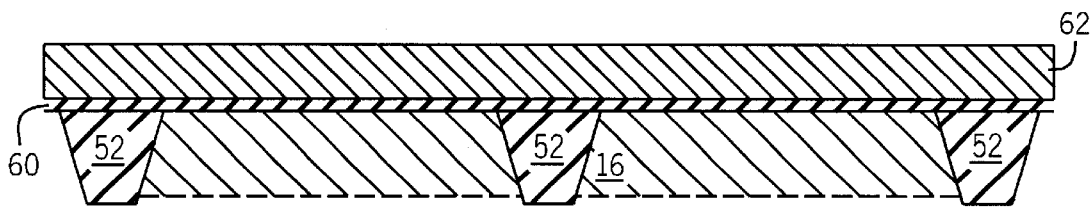
FIG. 2 is a cross-sectional view of the portion of the integrated circuit illustrated in FIG. 1, showing a photoresist deposition step.

In FIG. 2, portion 10 includes substrate 16 beneath a gate oxide layer 60 that is beneath layer 62. Layer 62 can be a semiconductor layer or film, such as, a polysilicon layer, or a polysilicon/germanium layer. Layer 60 is thermally grown and approximately 20–50 Å thick. Layer 62 is approximately 1200–1500 Å thick and deposited by chemical vapor deposition (CVD). Layer 62 is preferably undoped polysilicon.

Figure 3:
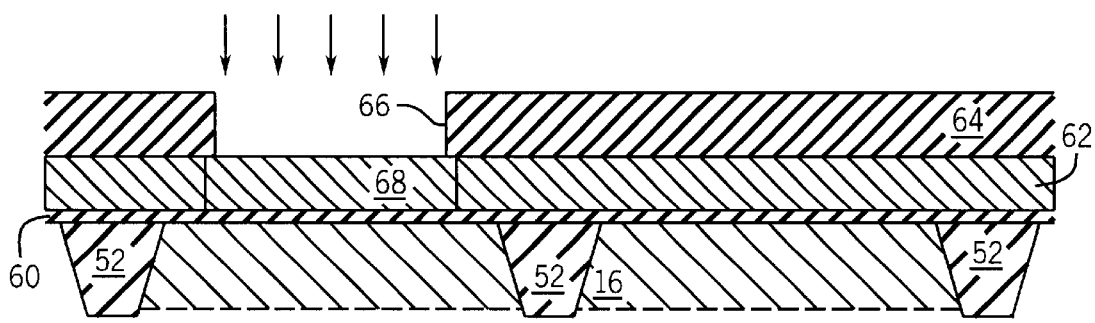
FIG. 3 is a cross-sectional view of the portion of the integrated circuit illustrated in FIG. 1, showing a first photoresist selective removal step.

In FIG. 3, layer 62 is substantially covered by a photoresist layer 64. Although not shown FIGS. 2–4, layer 62 can be covered by layer 26 (FIGS. 1, 5, 6, and 7). Layer 26 is preferably 150–200 Å deposited by CVD and can be utilized as an anti-reflective coating (ARC) for subsequent lithographic steps. Layer 26 can be provided by CVD.

Layer 64 is selectively etched to form a window or an aperture 66 between structures 52. After aperture 66 is formed, substrate 16 is subjected to a $N^+$ dopant implant. The $N^+$ dopant implant forms an $N^+$ doped region 68 in layer 62. The $N^+$ dopant can be $P^+$ (phosphorous), $As^+$ or other type dopant. After subjecting substrate 14 to the $N^+$ dopant implant, photoresist layer 64 is stripped.

Figure 4:
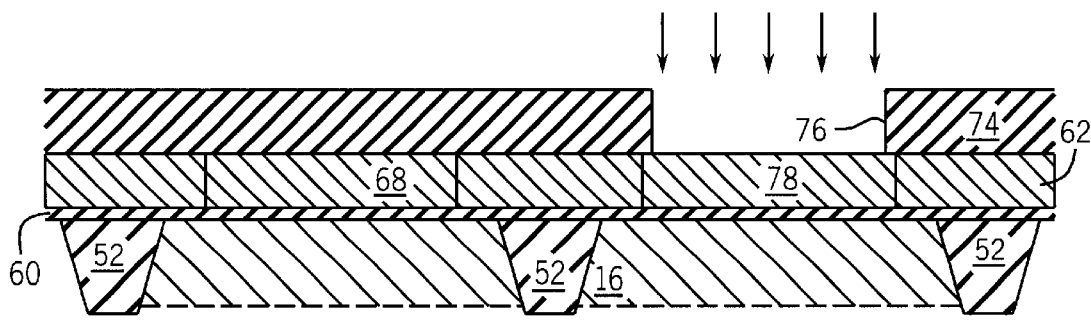
FIG. 4 is a cross-sectional view of the portion of the integrated circuit illustrated in FIG. 1, showing a second photoresist selective removal step.
Figure 5:
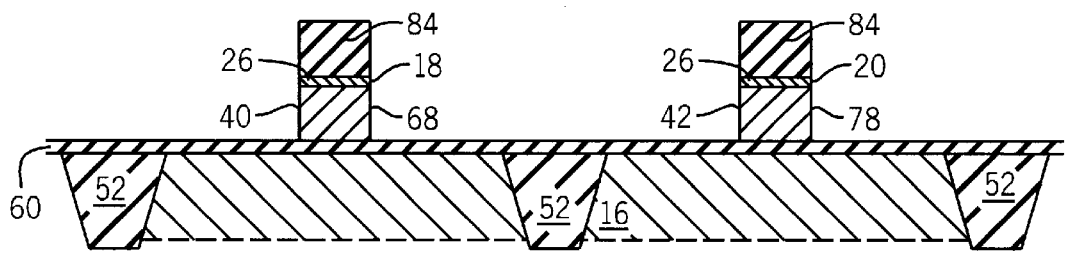
FIG. 5 is a cross-sectional view of the portion of the integrated circuit illustrated in FIG. 1, showing a gate stack formation step.

In FIG. 4, layer 62 is substantially covered with a photoresist layer 74. Photoresist layer 74 is selectively etched to form a window or an aperture 76 between structures 52. After aperture 76 is formed, substrate 16 is subjected to a $P^+$ dopant implant which forms a $P^+$ doped region 78 in layer 62. The $P^+$ dopant can be $B^+$, $BF_2^+$ or other dopant. After the $P^+$ dopant implant, layer 74 is stripped, a photoresist layer 84 is provided over layer 62 as shown in FIG. 5.

Layer 84 is patterned by E-beam lithography to define stacks 18 and 20. After patterning, stacks 18 and 20 are formed by anisotropic dry etching. The dry etching process removes portions of layers 26, layer 62 (FIG. 4) and layer 60 to leave stacks 18 and 20.

Figure 6:
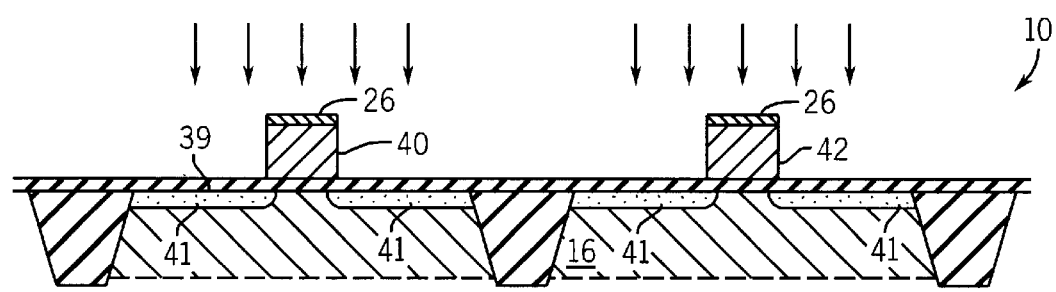
FIG. 6 is a cross-sectional view of the portion of the integrated circuit illustrated in FIG. 1, showing a shallow amorphization implant step.

In FIG. 6, layer 84 is stripped from stacks 18 and 20. After layer 84 is stripped, a high temperature, rapid thermal anneal at 1050–1200° C. for a period of 5 to 10 seconds is utilized to activate dopants in region 68 and 78.

In FIG. 6, portion 10 and substrate 16 are subjected to a shallow pre-amorphization implant (PAI) to form implant regions 41. Implant regions 41 are preferably amorphous silicon regions provided between 10–15 nm below top surface 39 of substrate 16. Regions 41 can be created by subjecting substrate 16 to an ion implantation technique. The ion implantation technique can charge semiconductor ions, such as, silicon or germanium ions, to approximately 10–100 kiloelectron volts (keVs) (preferably $Ge^+$ at 5–20 keV at a dose of $2-4\times10^{14}$ dopants per square centimeter) and implant them into substrate 16. Ion implantation can be performed by implantation devices manufactured by companies, such as, Varian Company of Palo Alta, Calif., Genius Company, and Applied Materials, Inc. The silicon and germanium ions change the single crystal silicon associated with substrate 16 into amorphous silicon at region 41. The amorphous silicon associated with region 41 is represented by a stippled area in the figures. Regions 41 correspond to extensions 23 and 25 (FIG. 1).

Substrate 16 is subjected to a dopant implant under separate photolithographic masks for the P-channel and N-channel transistors. The dopant implant can be arsenic (As), boron difluoride ($BF_2$), indium (In), phosphorous (P), or any appropriate for semiconductor fabrication options. The dopant implant is performed at a dose of $10^{13}$ dopants per $cm^2$.

Figure 7:
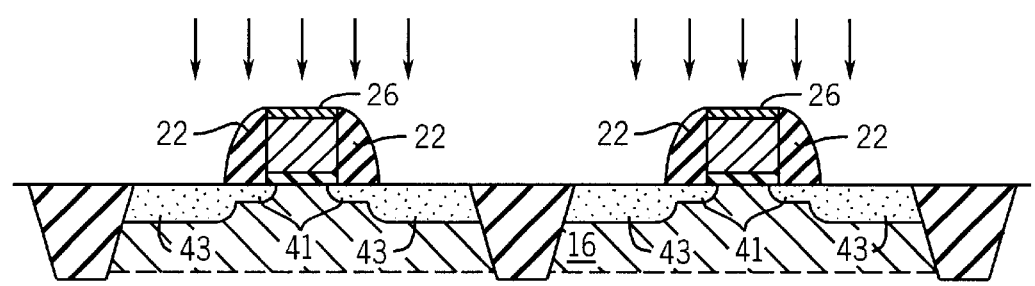
FIG. 7 is a cross-sectional view of the portion of the integrated circuit illustrated in FIG. 1, showing a deep amorphization implant step.

In FIG. 7, spacers 22 are formed according to a conventional deposition and etch back technique. After spacers 22 are formed, substrate 14 is subjected to a deep post-amorphization implant to form implant regions 43. Implant regions 43 are preferably amorphous silicon at a depth of approximately 60–80 nm. Regions 43 are formed by subjecting substrate 14 to an ion implantation technique, wherein silicon or germanium atoms are implanted to a depth between 60–80 nm ($Ge^+$ at 50–90 keV at a dose of $4-6\times10^{14}$ dopants per squared centimeter). Regions 43 are represented as a stippled area in the FIG. 7. The implantation techniques for forming regions 43 is similar to the technique for forming regions 41, except that the ions used to form regions 43 have more energy.

Layer 26 protects conductors 40 and 42 and the channel regions of transistors 12 and 14 from the dopant and amorphization implants discussed with reference to FIGS. 6 and 7.

After regions 43 are formed, substrate 16 is subjected to a dopant implant under separate masks (one for N-channel and one for P-channel transistors). The dopant implant is similar to the dopant implant discussed with reference to FIG. 4 and performed at a dose of $5\times10^{14}$ to $1\times10^{15}$ dopant per square centimeters. After the dopant implant, a low-temperature rapid thermal anneal (550–650° C., for 5–20 minutes) is utilized to recrystallize amorphous regions 41 and 43. Dopants within regions 43 and 41 become electrically activated during the crystal regrowth process. In FIG. 1, source and drain regions 30 and 32 including extensions 23 and 25 are thus formed under a low thermal budget. The dopant profiles associated with regions 30 and 32 are relatively close to the implanted profiles.

It is understood that, while preferred embodiments, examples, materials, and values are given, they are for the purpose of illustration only. The apparatus and method of the invention are not limited to the precise details and conditions disclosed. For example, although a source/drain ion amorphization technique is disclosed, other methods could utilize the principles of the present invention to create ultra-shallow source and drain extensions. Thus, changes may be made to the details disclosed without departing from the spirit of the invention, which is defined by the following claims.

What is claimed is:

1. A method of providing field effect transistors associated with an ultra-large scale integrated circuit, the method comprising:

forming a plurality of at least a portion of gate structures including an undoped gate conductor on a top surface of a silicon substrate;

doping the gate conductor;

providing a shallow amorphization implant, the shallow amorphization implant creating a shallow amorphous region near the top surface;

providing a deep amorphization implant, the deep amorphization implant creating a deep amorphous region in the substrate;

annealing the gate conductor;

doping the substrate for source and drain regions; and annealing the substrate to form the source and drain regions.

2. The method of claim 1, wherein the gate structure includes a cap layer.

3. The method of claim 2, wherein the first annealing step is performed at a temperature of more than 1050 degrees C. and the second annealing step is performed at a temperature of less than 650 degrees C.

4. The method of claim 3, wherein the first and second annealing steps are performed by rapidly heating.

5. The method of claim 3, wherein the transistors include source and drain extensions, the extensions being less than 30 nm deep.

6. A method of manufacturing an ultra-large scale integrated circuit including a plurality of field effect transistors having shallow source and drain extensions and deep source and drain regions, the method performed in the order listed and comprising steps of:

forming at least part of a gate structure on a top surface of a semiconductor substrate and annealing the gate structure;

providing a shallow amorphization implant, the shallow amorphization implant creating a shallow amorphous region near the top surface;

providing a deep amorphization implant, the deep amorphization implant creating a deep amorphous region in the substrate;

doping the substrate to form the deep source and drain regions; and annealing the substrate.

7. The method of claim 6, further comprising:

providing a protective layer comprising silicon oxynitride over the gate structure.

8. The method of claim 6, wherein the shallow and deep amorphization implants utilize germanium.

9. The method of claim 6, wherein the first annealing step heats the gate structure to above 1050 degrees.

10. The method of claim 6, wherein the second annealing step heats the substrate to less than 650 degrees Celsius.

11. A method of manufacturing an integrated circuit, the method comprising:

forming at least a portion of a gate conductor including a doped semiconductor material on a top surface of a substrate;

annealing the gate conductor in a high thermal budget process;

providing a first amorphization implant, the first amorphization implant creating a first amorphous region near the top surface of the substrate;

providing a second amorphization implant, the second amorphization implant creating a deep amorphous region in the substrate;

doping the substrate to form source and drain regions; and annealing the substrate in a low thermal budget process.

12. The method of claim 11, wherein the deep amorphous region is 60–80 nm below the top surface.

13. The method of claim 12, wherein the first amorphous region is 10–15 nm below the surface.

14. The method of claim 13, wherein between the providing a first amorphization implant and a second amorphization implant, spacers are provided adjacent the gate conductor.

15. The method of claim 11, further comprising forming spacers before the second amorphization implant step.

16. The method of claim 11, wherein the first and second annealing steps are rapid thermal annealing steps.

17. The method of claim 11, wherein the first annealing step involves a temperature of more than 1050 degrees Celsius.

18. The method of claim 11, wherein the second annealing step involves a temperature of less than 650 degrees Celsius.

19. The method of claim 18, wherein the second annealing step is performed for less than 20 minutes.

20. The method of claim 11, wherein the gate structure includes a protective layer above a polysilicon or polysilicon germanium layer.

* * * * *